(12) United States Patent
Wang et al.

(10) Patent No.: US 8,773,158 B2
(45) Date of Patent: Jul. 8, 2014

(54) INSPECTION METHOD

(75) Inventors: Chien-Ping Wang, Yunlin County (TW); Shih-Chun Yang, Kaohsiung (TW); Tzung-Te Chen, Taipei (TW); An-Tse Lee, Hsinchu County (TW); Sheng-Bang Huang, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 369 days.

(21) Appl. No.: 13/114,039

(22) Filed: May 23, 2011

(65) Prior Publication Data
US 2012/0169345 A1 Jul. 5, 2012

(30) Foreign Application Priority Data
Jan. 3, 2011 (TW) ............... 100100062 A

(51) Int. Cl.
*G01R 31/26* (2014.01)
(52) U.S. Cl.
USPC ...... 324/762.07; 324/414; 324/238; 702/136; 250/310
(58) Field of Classification Search
USPC ............... 324/238, 762.07; 702/136; 250/310
See application file for complete search history.

(56) References Cited

U.S. PATENT DOCUMENTS

| | | | |
|---|---|---|---|
| 5,730,634 A | 3/1998 | Seko | |
| 7,888,942 B2 * | 2/2011 | Chen et al. | 324/414 |
| 7,982,486 B2 * | 7/2011 | Lin et al. | 324/762.07 |
| 8,237,408 B2 * | 8/2012 | Carkner et al. | 320/132 |
| 8,437,110 B2 * | 5/2013 | Nakamura et al. | 361/93.8 |
| 2004/0253754 A1 | 12/2004 | Zhuang et al. | |
| 2010/0004892 A1 | 1/2010 | Lin et al. | |
| 2010/0188053 A1 | 7/2010 | Carkner et al. | |
| 2010/0327872 A1 * | 12/2010 | Chen et al. | 324/414 |

FOREIGN PATENT DOCUMENTS

| | | |
|---|---|---|
| CN | 1743864 | 3/2006 |
| CN | 201145717 | 11/2008 |
| CN | 101426318 | 5/2009 |

(Continued)

OTHER PUBLICATIONS

Zhang et al., Thermal stability of InGaN multiple-quantum-well light-emitting diodes on an AlN/sapphire template, Journal of Applied Physics, Mar. 15, 2004, pp. 3170-3174, vol. 95, No. 6.

Lu et al., A Full-Duplex Radio-on-photonic Crystal Fiber Transport System, Photonics Technology Letters, IEEE, Jun. 1, 2007, pp. 831-833, vol. 19 No. 11.

(Continued)

*Primary Examiner* — Arleen M Vazquez
*Assistant Examiner* — Alesa Allgood
(74) *Attorney, Agent, or Firm* — Jianq Chyun IP Office

(57) ABSTRACT

An inspection system is provided, which applies a forward or reverse voltage on a light-emitting device and measures a current thereof respectively before and after temperature rise, and determines whether the device fails according to the fact whether a current difference before and after the temperature rise is larger than a failure current determination value. Alternatively, the inspection system adopts a current applying device to apply a forward and reverse current on a light-emitting device and measures a voltage difference thereof respectively before and after temperature rise, and determines whether the device fails according to the fact whether a difference of the voltage differences before and after the temperature rise is larger than a failure voltage determination value. Alternatively, the inspection system adopts a predetermined inspecting step and a rapid inspecting step respectively to determine whether a light-emitting device fails. An inspection method for the inspection system is also provided.

23 Claims, 13 Drawing Sheets

(56) References Cited

FOREIGN PATENT DOCUMENTS

| | | |
|---|---|---|
| JP | 2000-222686 | 8/2000 |
| JP | 2003-250201 | 9/2003 |
| TW | 200913786 | 3/2009 |
| TW | 200915610 | 4/2009 |
| WO | 2009128478 | 10/2009 |

OTHER PUBLICATIONS

Cao et al., Electrical characteristics of InGaN/GaN light-emitting diodes grown on GaN and sapphire substrates, Applied Physics Letters, Jul. 5, 2004, pp. 7-9, vol. 85 No. 1.

"Office Action of Taiwan Counterpart Application", issued on Dec. 3, 2013, p. 1-p. 7.

"Office Action of China Counterpart Application", issued on Dec. 18, 2013, p. 1-p. 8.

* cited by examiner

INSPECTION METHOD

CROSS-REFERENCE TO RELATED APPLICATION

This application claims the priority benefit of Taiwan application serial no. 100100062, filed Jan. 3, 2011. The entirety of the above-mentioned patent application is hereby incorporated by reference herein and made a part of this specification.

TECHNICAL FIELD

The disclosure relates to an inspection method, and more particularly to an inspection method for inspecting a die quality of a light-emitting device.

BACKGROUND

The quality and lifespan testing method of the light-emitting diode (LED) has become a hot topic discussed worldwide in recent years. Among others, the Illuminating Engineering Society of North America (IESNA) completed a method for measuring lumen maintenance of LED light sources (LM-80-08) in September 2008 and proposed a set of specifications for the lifespan testing method of the LED device, array and module.

According to the content of the specifications, the lifespan testing of the LED consumes a lot of resources and time, so the manufacturers normally screen the early decaying samples by performing the quality verification and short-term aging testing according to the basic factory specification. However, currently, there is no rapid inspection method for reducing and even omitting the shot-term aging testing step and time before the outgoing of the LED device, thus causing the increase of the manufacturing process and cost. Therefore, it is in need of an online rapid inspection mechanism and method to design and construct a highly efficient measuring platform to provide significant benefits for improving the quality and reliability of the domestic LEDs.

SUMMARY

The disclosure provides an inspection method applied to inspect a die quality of at least one light-emitting device. The inspection method at least includes the following steps. A voltage is applied on the at least one light-emitting device at a first temperature. A first current of the at least one light-emitting device under the applied voltage is measured at the first temperature. The at least one light-emitting device is heated from a first temperature to a second temperature. Then, a voltage is applied on the at least one light-emitting device at the second temperature. A second current of the at least one light-emitting device under the applied voltage is measured at the second temperature. It is determined whether a difference between the second current and the first current is larger than a failure current determination value, and if the difference between the second current and the first current is larger than the failure current determination value, the at least one light-emitting device is determined to be a failed device.

The disclosure also another provides an inspection method applied to inspect a die quality of at least one light-emitting device. The inspection method at least includes the following steps. A forward current and a reverse current are applied on the at least one light-emitting device respectively at different time at a first temperature by a current applying device. A first forward voltage and a first reverse voltage of the at least one light-emitting device respectively under the forward current and the reverse current are measured at different time at the first temperature, in which a difference between the first forward voltage and the first reverse voltage is defined as a first voltage difference. The at least one light-emitting device is heated from the first temperature to a second temperature. Then, the forward current and the reverse current are applied on the at least one light-emitting device respectively at different time at the second temperature by the current applying device. A second forward voltage and a second reverse voltage of the at least one light-emitting device respectively under the forward current and the reverse current are measured at different time at the second temperature, in which a difference between the second forward voltage and the second reverse voltage is defined as a second voltage difference. It is determined whether a difference between the second voltage difference and the first voltage difference is larger than a failure voltage determination value, and if the difference between the second voltage difference and the first voltage difference is larger than the failure voltage determination value, the at least one light-emitting device is determined to be a failed device.

The disclosure further another provides an inspection method, which at least includes the following steps. An unfailed die and a failed die are provided. A predetermined inspection pulse current is applied on the unfailed die and the failed die respectively in a predetermined inspection time to obtain a current to voltage relation for distinguishing the unfailed die and the failed die, and a pulse damage current is defined when a current to voltage relation of the unfailed die and the failed die under the predetermined inspection pulse current is deviated from a linear relation. A failure voltage determination value is defined according to the measured current to voltage relation. A rapid inspection pulse current is applied on a die of at least one light-emitting device in a rapid inspection time, in which the rapid inspection pulse current is smaller than the pulse damage current. A voltage of the at least one light-emitting device is measured when the rapid inspection pulse current is applied thereon. It is determined that the at least one light-emitting device is a failed device when the voltage value is larger than the failure voltage determination value.

In view of the above, according to the embodiments of the disclosure, the inspection system adopts the voltage applying device to respectively apply the forward or reverse voltage on the light-emitting device before and after the temperature rise and measures the current thereof, and determines whether the device fails according to the fact whether the current difference before and after the temperature rise is larger than the failure current determination value. Alternatively, the inspection system adopts the current applying device to respectively apply the forward and reverse current on the light-emitting device before and after the temperature rise and measures the voltage difference thereof before and after the temperature rise, and determines whether the device fails according to the fact whether the difference between the voltage differences before and after the temperature rise is larger than the failure voltage determination value. Alternatively, the inspection system adopts the predetermined inspecting step and the rapid inspecting step respectively to determine whether the light-emitting device fails. The disclosure further provides the inspection method applicable for the inspection system.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

The First Embodiment

Figure 1:
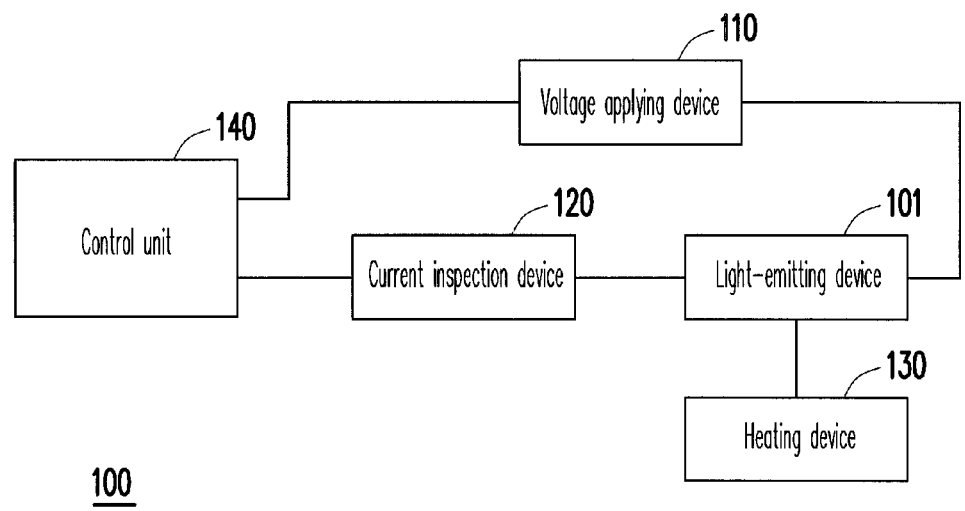
FIG. 1 is a schematic view illustrating electrical connection of an inspection system according to a first embodiment of the disclosure.
Figure 2:
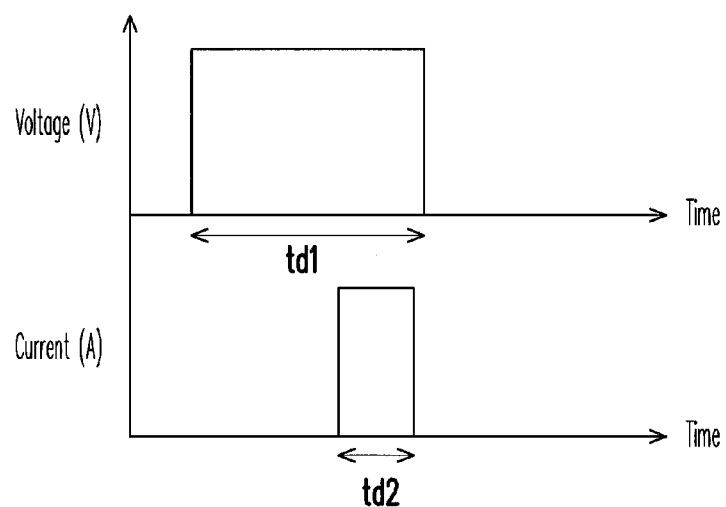
FIG. 2 is a relation diagram illustrating a voltage output by a voltage applying device and a current measured by a current inspection device for a light-emitting device in FIG. 1 respectively relative to time.
Figure 3A:
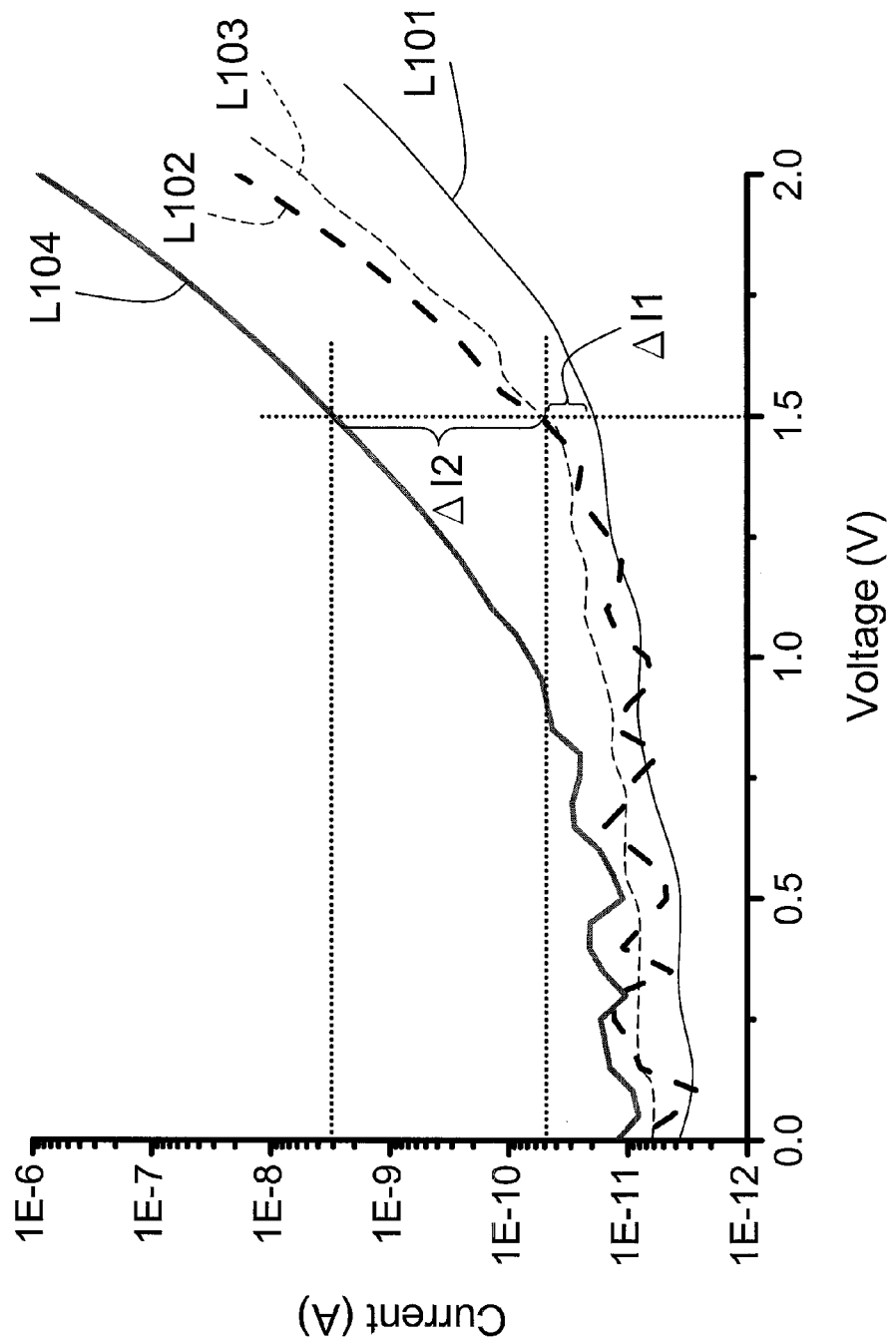
FIG. 3A and FIG. 3B are current to voltage curve diagrams of inspecting a die quality by using the inspection system in FIG. 1 respectively.
Figure 3B:
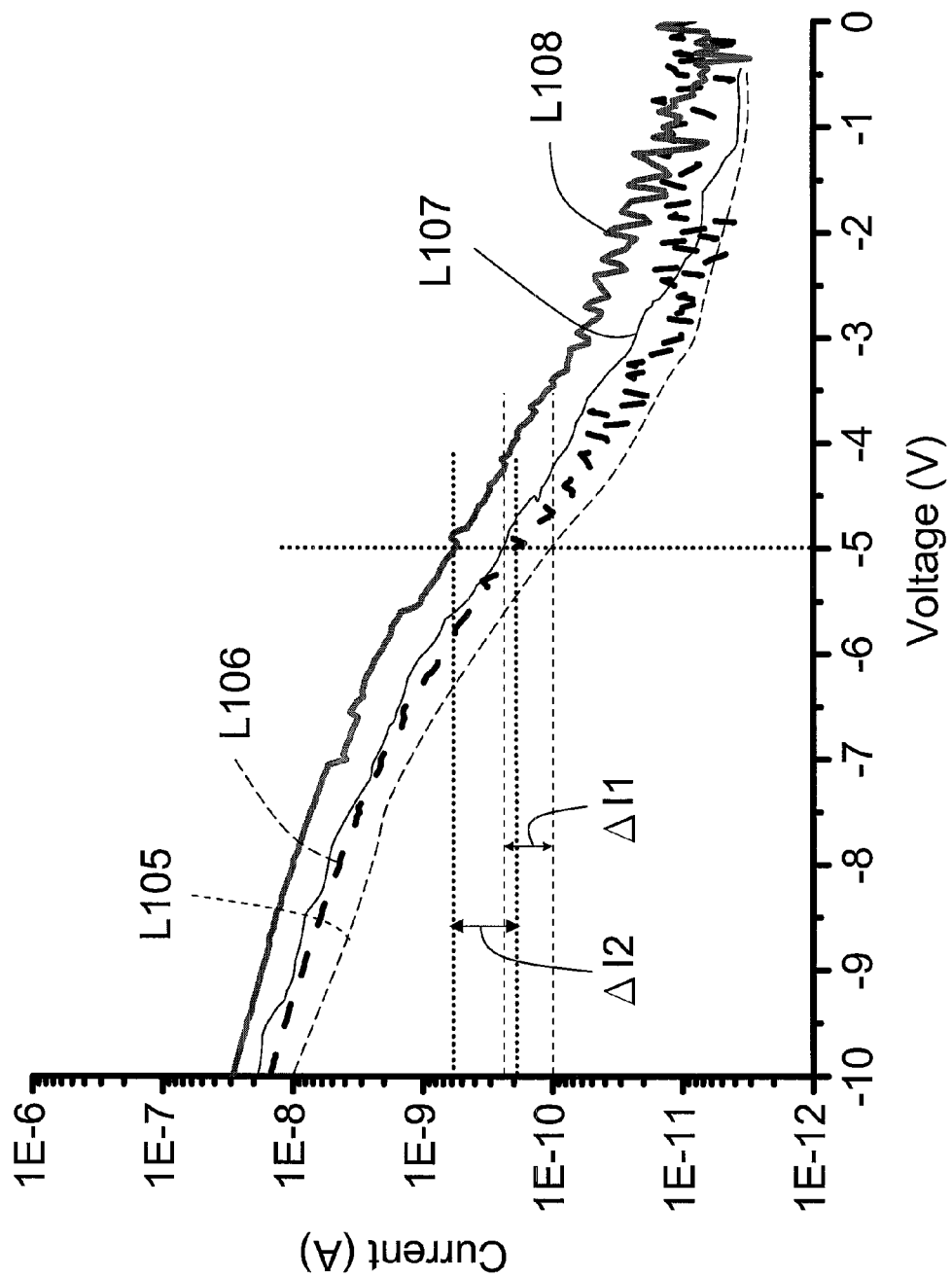

FIG. 1 is a schematic view illustrating electrical connection of an inspection system according to a first embodiment of the disclosure, FIG. 2 is a relation diagram illustrating a voltage output by a voltage applying device and a current measured by a current inspection device for a light-emitting device in FIG. 1 respectively relative to time, and FIG. 3A and FIG. 3B are current to voltage curve diagrams of inspecting a die quality by using the inspection system in FIG. 1 respectively. Referring to FIG. 1, the inspection system 100 of this embodiment is capable of determining the die quality of at least one light-emitting device 101 in a short time (e.g., several minutes), thereby reducing the manufacturing cost and time of the product. For example, generally, in the testing of the die quality of the light-emitting device, a 1000-hour continuous probing measurement experiment is performed, and if the die after undergoing the 1000-hour continuous probing measurement experiment still maintains a certain luminance, the light-emitting device is determined to be a normal device; otherwise, the light-emitting device is determined to be a failed device. Besides, currently, a rapid inspection method includes performing a 72-hour accelerated aging experiment to find out the failed device after the 1000 hours; however, the inspection time of this method is still too long.

In view of the above, this embodiment provides the inspection system 100 for rapidly inspecting the die quality of the light-emitting device 101. The inspection system 100 includes a voltage applying device 110, a current inspection device 120, a heating device 130 and a control unit 140, as shown in FIG. 1. The voltage applying device 120 is electrically connected to the at least one light-emitting device 101 and applies a voltage on the at least one light-emitting device 101. The current inspection device 120 is electrically connected to the at least one light-emitting device 101 and measures a current generated by the light-emitting device 101 under the voltage applied by the voltage applying device 110. In this embodiment, the voltage applying device 110 is, for example, a voltage source for applying the voltage on the light-emitting device 101, and the current inspection device 120 is, for example, a current meter for measuring the current generated by the light-emitting device 101 under the applied voltage. The voltage applied by the voltage applying device 110 is a forward voltage and/or a reverse voltage. In addition, the current meter of this embodiment is a rapid and high-resolution current meter, in which the current resolution should be smaller than 1 nA and smaller than 1 pA, so as to achieve an inspection accuracy.

In this embodiment, if the voltage applied by the voltage applying device 110 on the light-emitting device 101 is the forward voltage, the current inspection device 120 measures the forward current correspondingly; on the contrary, if the voltage applied by the voltage applying device 110 on the light-emitting device 101 is the reverse voltage, the current inspection device 120 measures the reverse current correspondingly. In this embodiment, the voltage may be a pulse voltage or a direct current (DC) voltage, and a time period in which the voltage applying device 110 applies the voltage on the at least one light-emitting device 101 is defined as a voltage sustaining time td1. In addition, a time period in which the current inspection device 120 measures the current of the at least one light-emitting device 101 is defined as a current measuring time td2, and the current measuring time td2 is smaller than or equal to the voltage sustaining time td1, as shown in FIG. 2. In this embodiment, the voltage sustaining time td1 should be smaller than 100 μs and between 10 μs to 50 μs, so as to avoid causing the thermal effect and influencing the measurement result.

The heating device 130 is used for heating the at least one light-emitting device 101 from a first temperature T1 to a second temperature T2. When the at least one light-emitting device 101 is at the first temperature T1, the current, generated by the at least one light-emitting device 101 under the voltage applied by the voltage applying device 110, measured by the current inspection device 120 is defined as a first current; while when the at least one light-emitting device 101 is at the second temperature T2, the current, generated by the at least one light-emitting device 101 under the voltage applied by the voltage applying device 110, measured by the current inspection device 120 is defined as a second current. In this embodiment, the second temperature T2 falls within a range of 70° C. to 400° C., and falls within a range of 100° C. to 300° C. to avoid damage to the die.

The current to voltage curves L101 and L102 in FIG. 3A are measured when the light-emitting device 101 are respectively an unfailed die and a failed die at the first temperature (e.g., 300 K) at the forward voltage. It can be seen from FIG. 3A that, the current to voltage curves L101 and L102 cannot be effectively distinguished from each other at the room temperature. Therefore, the inspection device 100 of this embodiment uses the heating device 130 to heat the light-emitting device 101 from the first temperature T1 to the second temperature T2. The current to voltage curves L103 and L104 in FIG. 3A are then measured when the light-emitting device 101 are respectively an unfailed die and a failed die at the second temperature (e.g., 400 K) at the forward voltage. In this embodiment, when the voltage applied by the voltage applying device 110 is the forward voltage, the forward voltage falls within a range between 0 to 3.5 V before the range where the voltage and the current are deviated from a linear relation.

In FIG. 3A, the current difference ΔI1 is the difference between measured current values of unfailed die before and after the temperature rise when the voltage is 1.5 V, and ΔI2 is the difference between measured current values of failed die before and after the temperature rise when the voltage is 1.5 V. After comparing the current differences ΔI1 and ΔI2, it can be found that the current difference ΔI2 of the failed die is apparently larger than the current difference ΔI1 of the unfailed die. However, according to different categories and sizes of the die, the current difference ΔI2 of the failed die is not always apparent under the forward voltage, so that in order to increase the precision of the die quality inspection, the current difference is measured before and after the temperature rise when the reverse voltage is applied, as shown in FIG. 3B, and the relevant descriptions are given below.

The current to voltage curves L105 and L106 in FIG. 3B are measured when the light-emitting device 101 are respectively an unfailed die and a failed die at the first temperature (e.g., 300 K) at the reverse voltage. It can be seen from FIG. 3B that, the current to voltage curves L105 and L106 cannot be effectively distinguished from each other at the room temperature. Likewise, the heating device 130 is used to heat the light-emitting device 101 from the first temperature T1 to the second temperature T2. The current to voltage curves L107 and L108 in FIG. 3A are then measured when the light-emitting device 101 are respectively an unfailed die and a failed die at the second temperature (e.g., 400 K) at the reverse voltage. In this embodiment, when the voltage applied by the voltage applying device 110 is the reverse voltage, the range of the reverse voltage needs to be smaller than a breakdown voltage of the at least one light-emitting device 101, in which the breakdown voltage differs in accordance with different device structures.

In FIG. 3B, the current difference ΔI1 is the difference between measured current values of unfailed die before and after the temperature rise when the voltage is −5 V, and ΔI2 is the difference between measured current values of failed die before and after the temperature rise when the voltage is −5 V. After comparing the current differences ΔI1 and ΔI2, it can be found that the current difference ΔI2 of the failed die is apparently larger than the current difference ΔI1 of the unfailed die.

In view of the above, the user can make statistics respectively on the current differences ΔI1 and ΔI2 of the unfailed die and the failed die before and after the temperature rise by sampling multiple measure values of unfailed dies and failed dies, so as to obtain a failure current determination value ΔI, in which the applied voltage is the forward voltage or the reverse voltage, and the failure current determination value ΔI changes accordingly. In this embodiment, the failure current determination value is generally increased with the rise of the second temperature T2. That is, a higher temperature may result in more apparent changes of the electrical performance of the failed die at the early stage, thereby obtaining a better distinguishing effect. However, to avoid damage to the die caused by the excessive rise of the temperature in the testing, the second temperature T2 is at least smaller than 400° C.

In other words, when the die quality inspection of the light-emitting device 101 is performed, the voltage (the forward voltage and/or the reverse voltage) is firstly applied on the light-emitting device 101, and the corresponding current is measured at the same time. Then, the current to voltage relation of the light-emitting device 101 after the temperature rise is measured. Afterward, it is determined whether the light-emitting device 101 is a failed device according to the fact whether the current difference of the light-emitting device 101 before and after the temperature rise is larger than the failure current determination value ΔI, in which the failed device normally refers to the light-emitting device 101 that fails to pass the common 1000-hour continuous probing measurement experiment, that is, the device probably has defects like early decaying.

In addition, the control unit 140 is electrically connected to the voltage applying device 110 and the current inspection device 120, and used for controlling the voltage applied by the voltage applying device 110 and recording the first current and the second current measured by the current inspection device 120 before and after the temperature rise. In this embodiment, if the difference between the second current and the first current of the inspected light-emitting device 101 is larger than the failure current determination value, the control unit 140 determines that the light-emitting device 101 is a failed device.

Figure 3C:
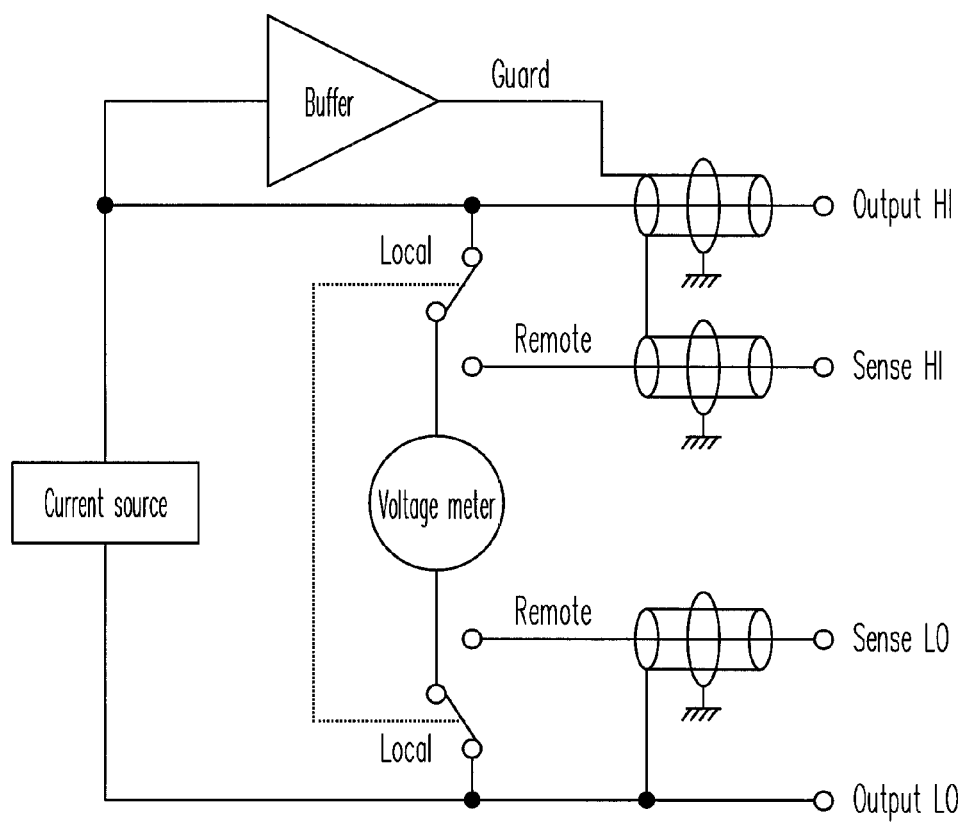
FIG. 3C is a schematic circuit diagram of the inspection system in FIG. 1.

The voltage applying device 110 and the current inspection device 120 of this embodiment may be a Source Measure Unit (SMU) instrument that integrates the voltage applying device 110 and the current inspection device 120, such as the product of Keithley 236. In this embodiment, the SMU instrument is capable of synchronously outputting and measuring the voltage or current, that is, integrating the voltage source and the current meter, and the implementing circuit is as shown in FIG. 3C. In other words, the instrument that integrates the voltage applying device 110 and the current inspection device 120 may be used for outputting or measurement in automatic testing.

The control unit 140 of this embodiment is the LabVIEW software added to the Keithley 236. The control unit 140 is used for controlling the voltage applying device 110 and the current inspection device 120. The instrument that integrates the voltage applying device 110 and the current inspection device 120 is taken as an example, and this instrument normally has a connection port like GPIB, USB, IEEE1394, MODBUS, serial port or parallel port for the user to operate and read the measurement values through the control unit 140. That is, in a computer host, the LabVIEW software enables the user to control the instrument to supply the voltage or the current through the operations of the computer host and read the values detected by the instrument.

In other embodiments, the voltage applying device 110 and the current inspection device 120 are also separated independent electronic devices, that is, the voltage applying device 110 may be merely the voltage source and the current inspection device 120 may be merely the current meter.

Besides, the inspection system 100 of this embodiment may different implementing methods by using different heating devices, such as the inspection systems 100a to 100e as shown in FIG. 4A to FIG. 4E, and the relevant descriptions are given below.

Figure 4A:
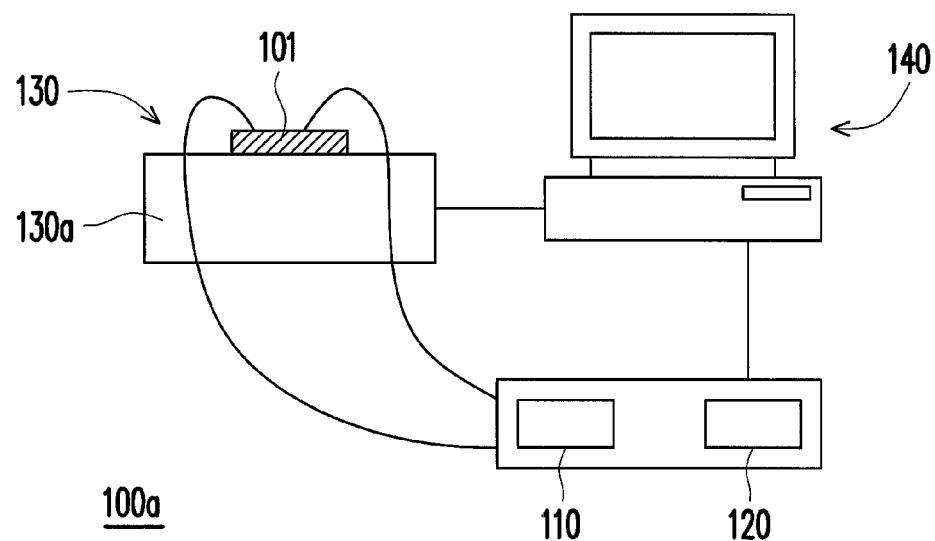
FIG. 4A to FIG. 4E are schematic views illustrating other possible implementations of the inspection system in FIG. 1.
Figure 4B:
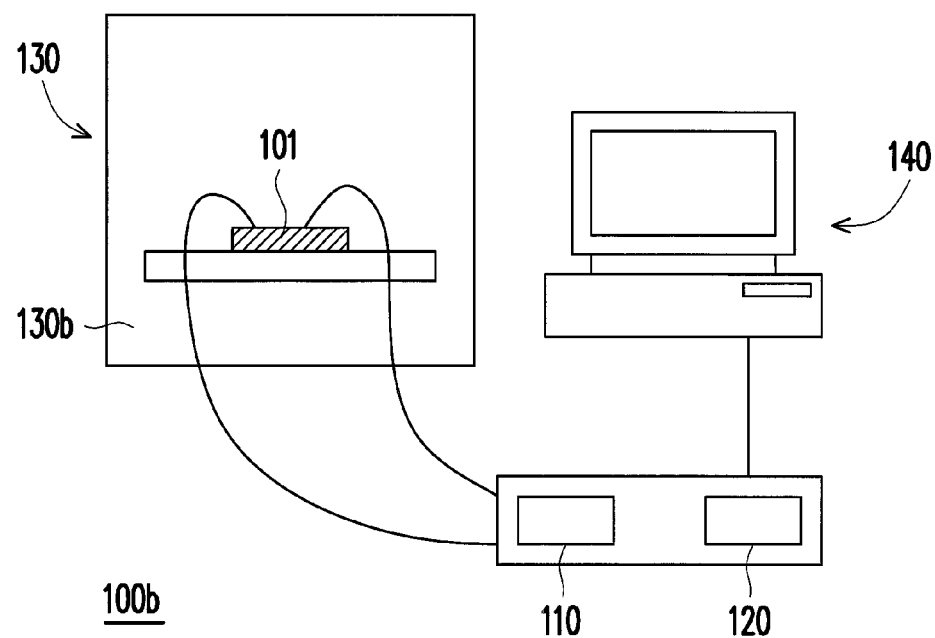

In the inspection system 100a of FIG. 4A, the heating device 130 is, for example, a heating platform 130a for heating the light-emitting device 101 from the first temperature T1 to the second temperature T2, in which the heating platform is, for example, a TE-Cooler or Hot-plate. In addition, in the inspection system 100b of FIG. 4B, the heating device 130 is, for example, an oven 130b for heating the light-emitting device 101 from the first temperature T1 to the second temperature T2, in which the light-emitting device 101 is placed in the oven 130b.

Figure 4C:
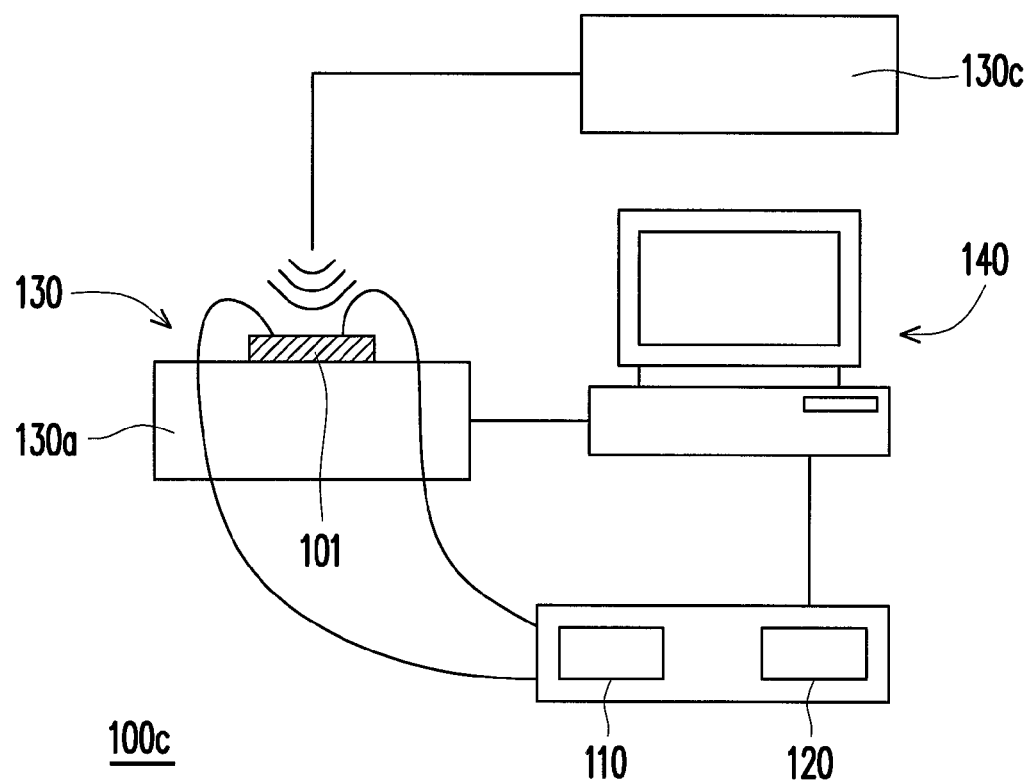
Figure 4D:
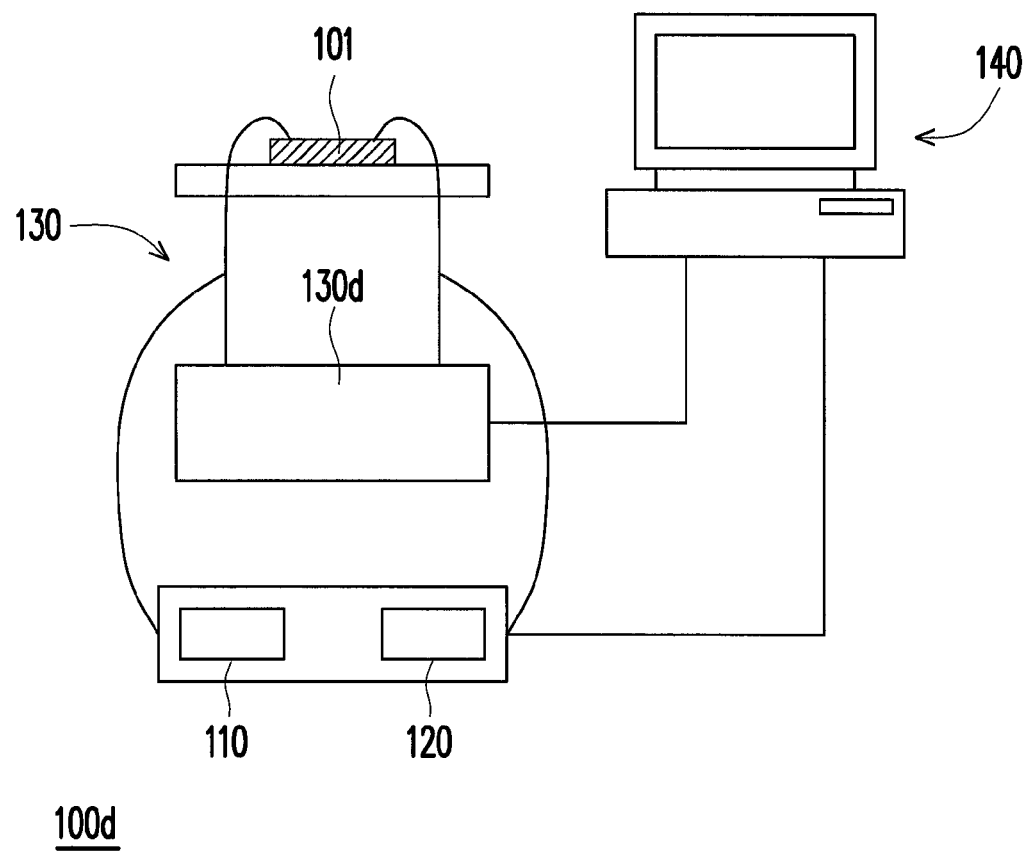

In the inspection system 100c of FIG. 4C, the heating device 130 is, for example, a microwave device 130c for heating the light-emitting device 101 from the first temperature T1 to the second temperature T2, in which the microwave device 130c may emit a microwave W1 for raising the temperature of the light-emitting device 101. In addition, in the inspection system 100d of FIG. 4D, the heating device 130 is, for example, a power supply device 130d for heating the light-emitting device 101 from the first temperature T1 to the second temperature T2, in which the power supply device 130d uses the current to heat the light-emitting device 101.

Figure 4E:
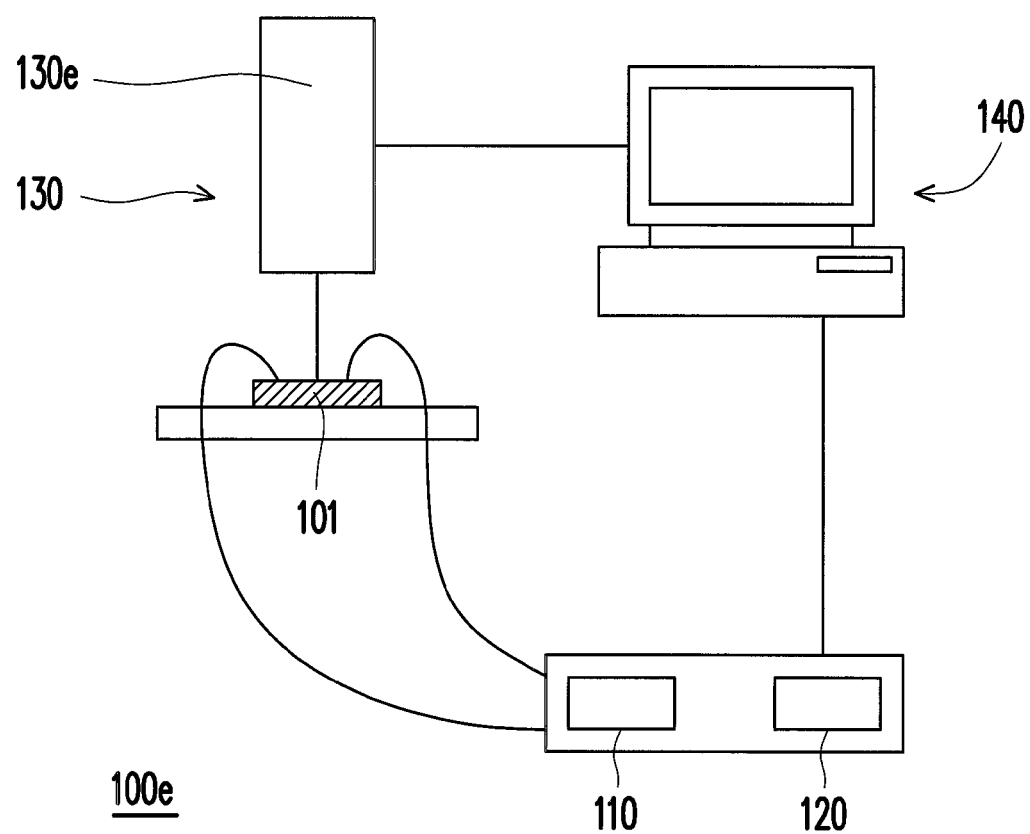

In the inspection system 100e of FIG. 4E, the heating device 130 is, for example, a laser device 130e for heating the light-emitting device 101 from the first temperature T1 to the second temperature T2, in which the laser device 130e is applied to provide a laser beam L1 on the light-emitting device 101, for heating the light-emitting device 101 from the first temperature T1 to the second temperature T2. In this embodiment, the wavelength range of the laser beam L1 is larger than or equal to the main light-emitting wavelength of at least one light-emitting device 101, and thus the energy of the laser beam L1 is mostly converted into the energy for heating the light-emitting device 101.

In the inspection systems 100a to 100e of FIG. 4A to FIG. 4E, the control unit 140 is, for example, a computer. The computer is electrically connected to the voltage applying device 110 and the current inspection device 120, and controls the voltage output by the voltage applying device 110 and records the current inspected by the current inspection device 120. To realize automatic inspection, the control unit 140 is also optionally electrically connected to the heating device 130 (e.g., the computer), and thus the voltage applying device 110, the current inspection device 120 and the heating device 130 may be directly controlled by operating the computer, thereby achieving the purpose of automatic inspection. The inspection systems 100a to 100e capable of automatically inspecting the die quality as shown in FIG. 4A to FIG. 4E are exemplary, and are not intended to limit the scope of the disclosure.

In view of the above description, this embodiment also provides an inspection method applied to inspect a die quality of at least one light-emitting device.

The inspection method at least includes the following steps. The above-mentioned voltage is applied on the light-emitting device 101 at the first temperature T1. A first current generated by the light-emitting device 101 under the applied voltage is measured at the first temperature T1. The heating light-emitting device 101 is heated from the first temperature T1 to the second temperature T2. Then, a voltage is applied on the light-emitting device 101 at the second temperature T2. A second current generated by the light-emitting device 101 under the applied voltage is measured at the second temperature T2. If the difference between the second current and the first current is larger than the failure current determination value ΔI, the light-emitting device 101 is determined to be a failed device.

In this inspection method, the light-emitting device 101 may be heated by using an oven, a laser device, a microwave device, a heating platform or by a current as described above. In this embodiment, when the light-emitting device 101 is heated by using the oven, the light-emitting device 101 is heated from the first temperature T1 to the second temperature T2 through hot air convection or a high temperature bulb.

The Second Embodiment

Figure 5:
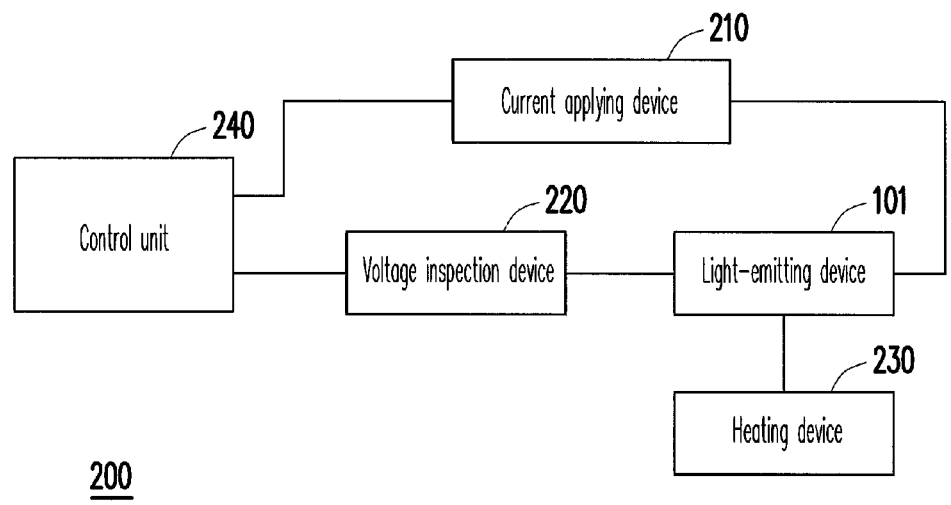
FIG. 5 is a schematic view illustrating electrical connection of an inspection system according to a second embodiment of the disclosure.
Figure 6A:
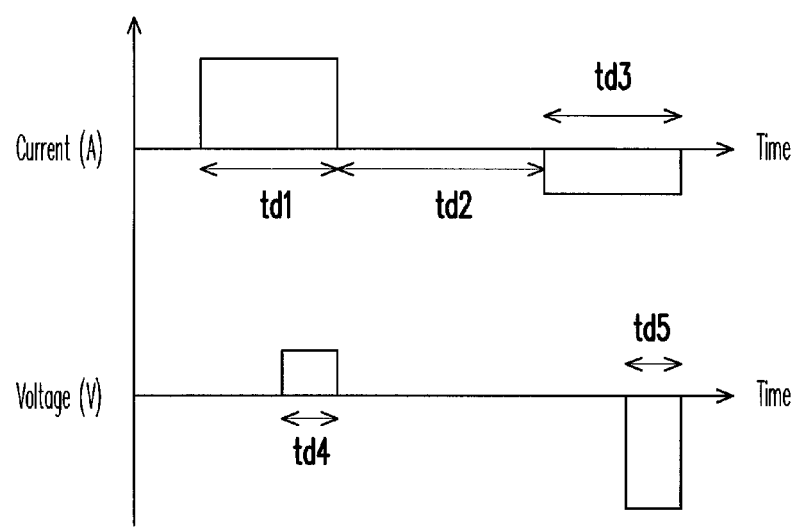
FIG. 6A is a relation diagram illustrating a current output by a current applying device and a voltage measured by a voltage inspection device for a light-emitting device in FIG. 5 respectively relative to time.
Figure 7:
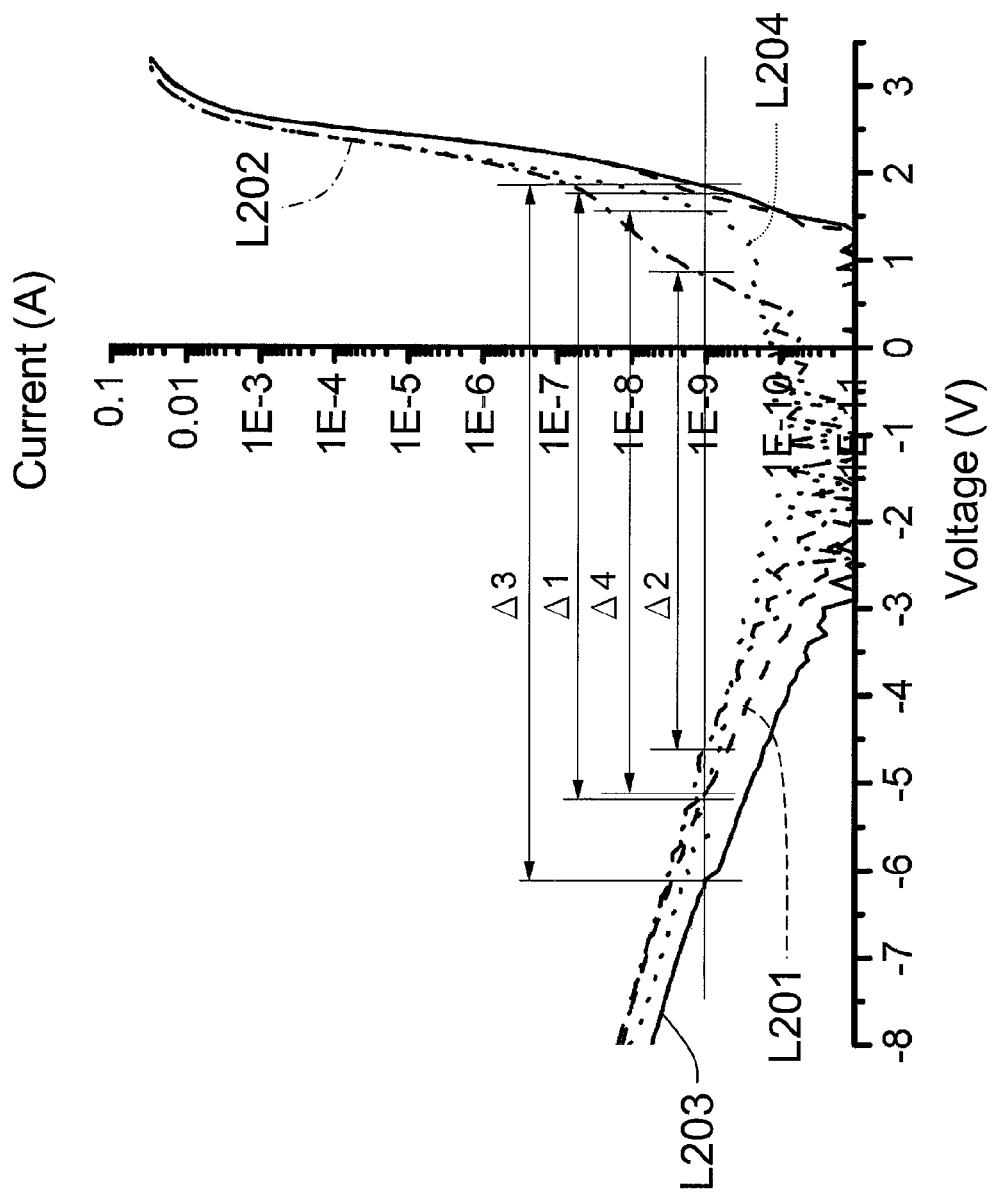
FIG. 7 is a current to voltage curve diagram of inspecting a die quality by using the inspection system in FIG. 5.

FIG. 5 is a schematic view illustrating electrical connection of an inspection system according to a second embodiment of the disclosure, FIG. 6A is a relation diagram illustrating a current output by a current applying device and a voltage measured by a voltage inspection device for a light-emitting device in FIG. 5 respectively relative to time, and FIG. 7 is a current to voltage curve diagram of inspecting a die quality by using the inspection system in FIG. 5. Referring to FIG. 5, the inspection system 200 of this embodiment may also determine the die quality of the at least one light-emitting device 101 in a short time (e.g., several minutes), thereby reducing the manufacturing cost and time of the product.

This embodiment provides the inspection system 200 for rapidly inspecting the die quality of the light-emitting device 101. The inspection system 200 includes a current applying device 210, a voltage inspection device 220, a heating device 230 and a control unit 240, as shown in FIG. 5. The current applying device 210 is electrically connected to the at least one light-emitting device 101, and applies a forward current and a reverse current on the light-emitting device 101 respectively at different time. The voltage inspection device 220 is electrically connected to the light-emitting device 101, and measures a forward voltage and a reverse voltage respectively generated by the light-emitting device 101 under the forward current and the reverse current applied by the current applying device 210. In this embodiment, the current applying device 210 is, for example, a current source for applying the current on the light-emitting device 101, and the voltage inspection device 220 is, for example, a voltmeter for measuring the voltage generated by the light-emitting device 101 under the applied current, in which the current applied by the current applying device 210 is the forward current and the reverse current.

In this embodiment, if the current applied by the current applying device 210 on the light-emitting device 101 is the forward current, the voltage inspection device 220 measures the forward voltage correspondingly; on the contrary, if the current applied by the current applying device 210 on the light-emitting device 101 is the reverse current, the voltage inspection device 220 measures the reverse voltage correspondingly. In this embodiment, the forward current and the reverse current are respectively a transient current, and the time in which the current applying device 210 respectively applies the forward current and the reverse current on the light-emitting device 101 may be respectively defined as a forward current sustaining time td1 and a reverse current sustaining time td3, as shown in FIG. 6A. In this embodiment, the forward current sustaining time td1 and the reverse current sustaining time td3 are between 10 μs to 50 μs, to avoid causing the thermal effect and influencing the measurement result. In addition, an interval between the forward current sustaining time td1 and the reverse current sustaining time td3 is defined as an interval time td2, in which the interval time td2 is 1 msec to 10 msec, as shown in FIG. 6A.

In addition, the heating device 230 is used for heating the light-emitting device 101 from the first temperature T1 to the second temperature T2. When the light-emitting device 101 is at the first temperature T1, the voltage inspection device 220 measures a first forward voltage FV1 and a first reverse voltage RV1 respectively generated by the light-emitting device 101 under the forward current and the reverse current applied by the current applying device 210, and a difference between the first forward voltage FV1 and the first reverse voltage RV1 is defined as a first voltage difference ΔV1. When the light-emitting device 101 is at the second temperature T2, the voltage inspection device 220 measures a second forward voltage FV2 and a second reverse voltage RV2 respectively generated by the light-emitting device 101 under the forward current and the reverse current applied by the current applying device 210, and a difference between the second forward voltage FV2 and the second reverse voltage RV2 is defined as a second voltage difference ΔV2. In this embodiment, the second temperature T2 falls within a range of 70° C. to 400° C., and falls within a range of 100° C. to 300° C. to avoid damage to the die.

In this embodiment, the time period in which the voltage inspection device 220 measures the first forward voltage FV1 or the second forward voltage FV2 of the light-emitting device 101 is defined as a first voltage measuring time td4, and the first voltage measuring time td4 is smaller than or equal to the forward current sustaining time td1. Besides, the time period in which the voltage inspection device 220 measures the first reverse voltage RV1 or the second reverse voltage RV2 of the light-emitting device 101 is defined as a second voltage measuring time td5, and the second voltage measuring time is smaller than or equal to the reverse current sustaining time, as shown in FIG. 6A.

Moreover, in FIG. 7, the current to voltage curves L201 and L202 are measured when the light-emitting device 101 is the failed die respectively at the first temperature (e.g., 25° C.) and the second temperature (e.g., 110° C.), and the current to voltage curves L203 and L204 are measured when the light-emitting device 101 is the unfailed die respectively at the first temperature and the second temperature. In the curves L201 and L202 of FIG. 7, under the same current (e.g., 1 nA), the voltage differences of the failed die at the first and second temperature are $\Delta V1$ and $\Delta V2$ respectively, and the voltage differences of the unfailed die at the first and second temperature are $\Delta V3$ and $\Delta V4$ respectively. Similar to the concept of the first embodiment, a difference of the voltage differences $\Delta V1-\Delta V2$ of the failed die is apparently larger than a difference of the voltage differences $\Delta V3-\Delta V4$ of the unfailed die.

Therefore, based on the concept and principle of the first embodiment, likewise, the user may also make statistics respectively on the differences of the voltage differences $\Delta V1-\Delta V2$ and $\Delta V3-\Delta V4$ of the unfailed die and the failed die by sampling the measure values of multiple unfailed dies and failed dies, so as to obtain a failure voltage determination value $\Delta V$, in which the failure voltage determination value $\Delta V$ changes according to different categories and sizes of the die. In this embodiment, the failure voltage determination value is generally increased with the rise of the second temperature T2. That is, a higher temperature may result in more apparent changes of the electrical performance of the failed die at the early stage, thereby obtaining a better distinguishing effect. However, to avoid damage to the die caused by the excessive rise of the temperature in the testing, the second temperature T2 is at least smaller than 400° C.

In other words, when the die quality inspection of the light-emitting device 101 is performed, the forward current and the reverse current are respectively applied on the light-emitting device 101, and the corresponding voltage difference $\Delta V1$ is measured at the same time. Then, the current to voltage relation of the measuring light-emitting device 101 after the temperature rise is measured. Afterward, it is determined whether the light-emitting device 101 is a failed device according to the fact whether the difference of the voltage differences $\Delta V1-\Delta V2$ of the light-emitting device 101 is larger than the failure voltage determination value $\Delta V$, in which the failed device normally refers to the light-emitting device 101 that fails to pass the common 1000-hour continuous probing measurement experiment, that is, the device probably has defects like early decaying.

The control unit 240 is electrically connected to the current applying device 210 and the voltage inspection device 220, and used for controlling the forward current and the reverse current applied by the current applying device 210 and recording the first voltage difference $\Delta V1$ and the second voltage difference $\Delta V2$ measured by the voltage inspection device 220 respectively at the first temperature and the second temperature. In this embodiment, if a difference $\Delta V1-\Delta V2$ between the first voltage difference $\Delta V1$ and the second voltage difference $\Delta V2$ is larger than the failure voltage determination value $\Delta V$, the control unit 240 determines that the at least one light-emitting device is a failed device.

Figure 6B:
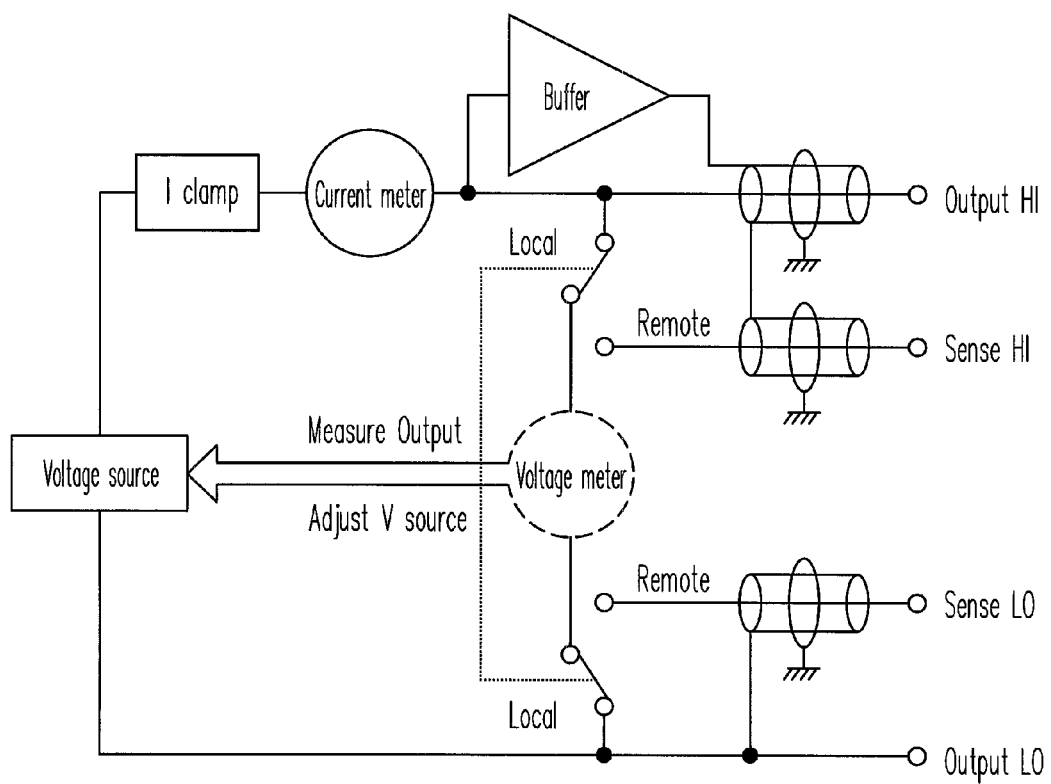
FIG. 6B is a schematic circuit diagram of the inspection system in FIG. 5.

Similarly, the current applying device 210 and the voltage inspection device 220 of this embodiment may also be an SMU instrument that integrates the current applying device 210 and the voltage inspection device 220, such as the aforementioned product of Keithley 236. In this embodiment, the SMU instrument is capable of synchronously outputting and measuring the voltage or current, that is, integrating the current source and the voltmeter, and the implementing circuit is as shown in FIG. 6B. In other words, the instrument that integrates the current applying device 210 and the voltage inspection device 220 may also be used for outputting or measurement in automatic testing.

Similarly, the control unit 240 of this embodiment is the LabVIEW software added to the Keithley 236. The control unit 240 is used for controlling the current applying device 210 and the voltage inspection device 220. The instrument that integrates the current applying device 210 and the voltage inspection device 220 is taken as an example, and this instrument normally has a connection port like GPIB, USB, IEEE1394, MODBUS, serial port or parallel port for the user to operate and read the measurement values through the control unit 240. That is, in a computer host, the LabVIEW software enables the user to control the instrument to supply the voltage or the current through the operations of the computer host and read the values detected by the instrument.

In other embodiments, the integrating current applying device 210 and the voltage inspection device 220 are also separated independent electronic devices, that is, the current applying device 210 may be merely the current source and the voltage inspection device 220 may be merely the voltmeter.

It should be noted that, the heating device 230 of this embodiment may, for example, adopt any implementation aspect of the heating device 130 as described above, so the relevant descriptions will not be given herein again. Besides, the Keithley 236 is, for example, an instrument that integrates the functions of the voltage source, the current source, the voltmeter and the current meter. In other words, the instrument can be directly applied in all the above-mentioned and the following embodiments.

Likewise, in view of the above, this embodiment also provides an inspection method applied to inspect the die quality of the light-emitting device. The inspection method at least includes the following steps. The forward current and the reverse current are respectively applied on the light-emitting device 101 at different time at the first temperature T1. The first forward voltage FV1 and the first reverse voltage RV1 respectively generated by the light-emitting device 101 under the forward current and the reverse current applied by the current applying device 210 are measured at different time at the first temperature T1, in which the difference between the first forward voltage FV1 and the first reverse voltage RV1 is defined as the first voltage difference $\Delta V1$. The light-emitting device 101 is heated from the first temperature T1 to the second temperature T2. The forward current and the reverse current are respectively applied on the light-emitting device 101 at different time at the second temperature T2. The second forward voltage FV2 and the second reverse voltage RV2 respectively generated by the light-emitting device 101 under the forward current and the reverse current applied by the current applying device 210 are respectively measured at different time at the second temperature T2, in which the difference between the second forward voltage FV2 and the second reverse voltage RV2 is defined as the second voltage difference ΔV2. It is determined whether the difference ΔV1−ΔV2 between the first voltage difference ΔV1 and the second voltage difference ΔV2 is larger than the failure voltage determination value ΔV, and if the difference ΔV1−ΔV2 between the first voltage difference ΔV1 and the second voltage difference ΔV2 is larger than the failure voltage determination value ΔV, the light-emitting device 101 is determined to be a failed device.

Likewise, in this inspection method, the method for heating the light-emitting device 101 may refer to the method disclosed in the first embodiment, and the details will not be repeated herein.

The Third Embodiment

Figure 8:
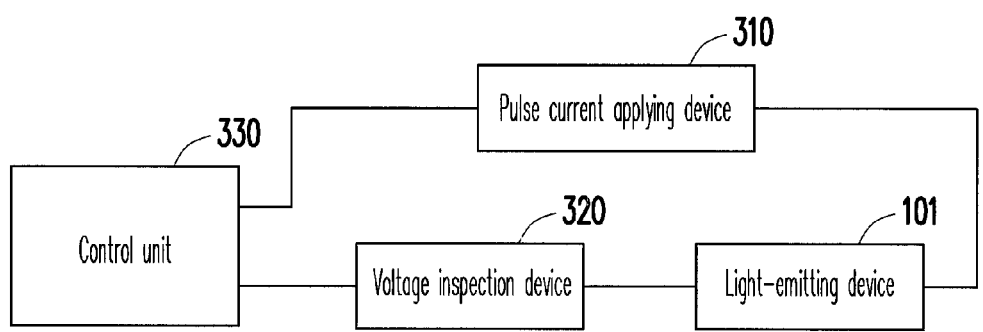
FIG. 8 is a schematic view illustrating electrical connection of an inspection system according to a third embodiment of the disclosure.
Figure 9:
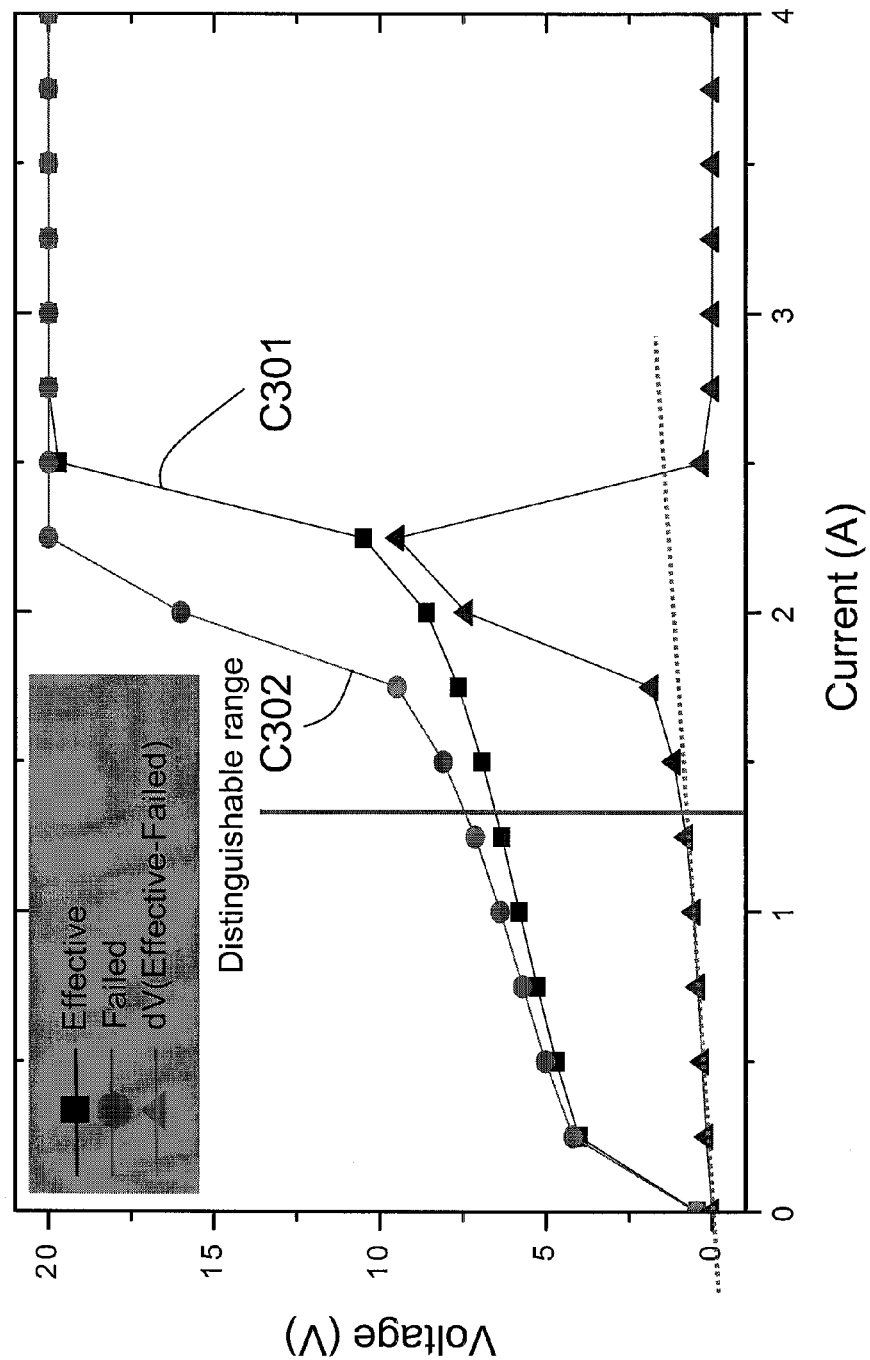
FIG. 9 is a current to voltage curve diagram of inspecting a die quality by using the inspection system in FIG. 8.

FIG. 8 is a schematic view illustrating electrical connection of an inspection system according to a third embodiment of the disclosure, and FIG. 9 is a current to voltage curve diagram of inspecting a die quality by using the inspection system in FIG. 8. Referring to FIG. 8, the inspection system 300 of this embodiment also determines the die quality of the at least one light-emitting device 101 in a short time (e.g., several minutes), thereby reducing the manufacturing cost and time of the product.

This embodiment provides the inspection system 300 for rapidly inspecting the die quality of the light-emitting device 101. The inspection system 300 includes a pulse current applying device 310, a voltage inspection device 320 and a control unit 330. The pulse current applying device 310 is electrically connected to the light-emitting device 101, and respectively sequentially applies a predetermined inspection pulse current in a predetermined inspection time and a rapid inspection pulse current in a rapid inspection time on the light-emitting device 101.

The predetermined inspection current is applied on the unfailed die and the failed die of the light-emitting device 101 respectively in the predetermined inspection time, and thus curves C301 and C302 as shown in FIG. 9 are obtained, in which the curves C301 and C302 respectively represent the current to voltage relations of the unfailed die and the failed die, and the unfailed die and the failed die of the light-emitting device 101 may be screened in advance through a long-time time probing measurement procedure. It can be found in the curves C301 and C302 that, the unfailed die and the failed die can be distinguished when a large current (e.g., a current larger than or equal to a rated operating current (e.g., 0.3 A)) is applied. It should be noted that, the pulse time of applying the predetermined inspection pulse current is smaller than 5 sec, so as to prevent the heat dissipation condition in the testing system from influencing the voltage measurement, and the time length of the pulse current can be adjusted in accordance with different testing samples.

In addition, the voltage inspection device 320 is electrically connected to the light-emitting device 101, and measures the first voltage generated by the light-emitting device 101 in the predetermined inspection time. In FIG. 9, when the current is larger than 1.5 A, the current to voltage curve is deviated from a linear relation, thus a pulse damage current could be defined. Taken the example of FIG. 9, the damage current is 1.5 A. The rapid inspection pulse current in the subsequent inspecting steps needs to be smaller than or equal to the pulse damage current.

In the predetermined inspection time, since the predetermined inspection pulse current is applied on the unfailed die and the failed die in advance, the criterion that in which ranges the pulse current is capable of distinguishing the unfailed die and the failed die is obtained. For example, in the curves C301 and C302 in FIG. 9 of this embodiment, the unfailed die and the failed die can be distinguished when the pulse current is larger than or equal to the rated operating current (e.g., 0.3 A) and is smaller than the pulse damage current (e.g., 1.5 A). Therefore, the pulse current ran is from 0.3 A to 1.5 A. The user can make statistics by sampling measure values of multiple unfailed dies and failed dies to obtain the pulse current range, and accordingly defines a failure voltage determination value in the pulse current range.

Then, in the rapid inspection time, the current applying device 210 applies a rapid inspection pulse current on the light-emitting device 101, and at this time the voltage inspection device 320 measures the second voltage correspondingly generated by the light-emitting device 101, in which the control unit 330 determines that the light-emitting device 101 is a failed device when the second voltage is higher than the failure voltage determination value. Taken FIG. 9 for example, the pulse current range where the unfailed die and the failed die can be effectively distinguished is between 0.3 A to 1.5 A. When the pulse current of 1.3 A is applied on the light-emitting device, if the corresponding voltage value is higher than the voltage value of the unfailed die applied with the same pulse current, the die is determined to be the failed die. In order to improve the die inspection accuracy of the inspection system 300, the current to voltage relations of multiple unfailed dies and failed dies need to be sampled, and thus the failure voltage determination value can be set more precisely. In this embodiment, the rapid inspection pulse current is at least larger than or equal to the rated operating current (e.g., 0.3 A).

The pulse current applying device 310 and the voltage inspection device 320 of this embodiment may also adopt the SMU instrument which integrates the pulse current applying device 310 and the voltage inspection device 320. In this embodiment, the SMU instrument is capable of synchronously outputting and measuring the voltage or current. In addition, the instrument that integrates the pulse current applying device 310 and the voltage inspection device 320 may be used for outputting or measurement in automatic testing.

Likewise, the control unit 330 of this embodiment is the LabVIEW software added to Keithley 2430. The control unit 330 is used for controlling the pulse current applying device 310 and the voltage inspection device 320. The instrument that integrates the pulse current applying device 310 and the voltage inspection device 320 is taken as an example, and this instrument normally has a connection port like GPIB, USB, IEEE1394, MODBUS, serial port or parallel port for the user to operate and read the measurement values through the control unit 330. That is, in a computer host, the LabVIEW software enables the user to control the instrument to supply the voltage or the current through the operations of the computer host and read the values detected by the instrument.

In other embodiments, the pulse current applying device 310 and the voltage inspection device 320 may also be separated independent electronic devices, that is, the pulse current applying device 310 may be merely the current source and the voltage inspection device 320 may be merely the voltmeter.

In view of the above, this embodiment also provides an inspection method, which at least includes the following steps. The unfailed die and the failed die are provided. The predetermined inspection pulse current is applied on the unfailed die and the failed die respectively in the predetermined inspection time to obtain the current to voltage relation to distinguish the unfailed die and the failed die, and the pulse damage current is defined when the current to voltage relation of the unfailed die and the failed die under the predetermined inspection pulse current is deviated from a linear relation. The failure voltage determination value is defined according to the current to voltage relation for distinguishing the unfailed die and the failed die obtained in the predetermined inspection time. In the rapid inspection time, the rapid inspection pulse current is applied on the die of the at least one light-emitting device 101, in which the rapid inspection pulse current is smaller than the pulse damage current. It is determined whether the light-emitting device is a failed device according to the fact whether the voltage value generated when the rapid inspection pulse current is applied on the die of the light-emitting device 101 is larger than the failure voltage determination value.

In this embodiment, the inspection method further includes defining the current inspection range according to the current to voltage relation for distinguishing the unfailed die and the failed die obtained in the predetermined inspection time, and the rapid inspection pulse current is in the current inspection range. In this embodiment, the current inspection range falls within a range of 0.3 A to 3 A.

In view of the above, the inspection system and the inspection method of the disclosure at least have the following advantages. The inspection system adopts the voltage applying device to respectively apply the forward or reverse voltage on the light-emitting device before and after the temperature rise and measures the current thereof, and determines whether the device fails according to the fact whether the current difference before and after the temperature rise is larger than the failure current determination value. Alternatively, the inspection system adopts the current applying device to respectively apply the forward and reverse current on the light-emitting device before and after the temperature rise and measures the voltage difference thereof before and after the temperature rise, and determines whether the device fails according to the fact whether the difference between the voltage differences before and after the temperature rise is larger than the failure voltage determination value. Alternatively, the inspection system adopts the predetermined inspecting step and the rapid inspecting step respectively to determine whether the light-emitting device fails. The disclosure further provides the inspection method applicable for the inspection system.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An inspection method, applied to inspect a die quality of at least one light-emitting device, comprising:
    applying a voltage on the at least one light-emitting device at a first temperature;
    measuring a first current of the at least one light-emitting device under the applied voltage at the first temperature;
    heating the at least one light-emitting device from the first temperature to a second temperature;
    applying a voltage on the at least one light-emitting device at the second temperature;
    measuring a second current of the at least one light-emitting device under the applied voltage at the second temperature, wherein the voltage comprises a forward voltage or a reverse voltage, such that when the voltage is the forward voltage, the first current and the second current are forward currents, and when the votage is the reverse voltage, the first current and the second current are reverse currents; and
    determining whether a difference between the second current and the first current is larger than a failure current determination value, wherein if the difference between the second current and the first current is larger than the failure current determination value, the at least one light-emitting device is determined to be a failed device.

2. The inspection method according to claim 1, wherein the failure current determination value is increased with the rise of the second temperature.

3. The inspection method according to claim 1, wherein the second temperature falls within a range of 70° C. to 400° C.

4. The inspection method according to claim 1, wherein when the voltage is the forward voltage, the forward voltage falls within a range before the range where the voltage and the current are deviated from a linear relation.

5. The inspection method according to claim 1, wherein when the voltage is the reverse voltage, the reverse voltage falls within a range smaller than a breakdown voltage of the at least one light-emitting device.

6. The inspection method according to claim 1, wherein the at least one light-emitting device is heated by using an oven, a laser device, a microwave device, a heating platform or by a current.

7. The inspection method according to claim 6, wherein when the at least one light-emitting device is heated by using the oven, the at least one light-emitting device is heated from the first temperature to the second temperature through hot air convection or a high temperature bulb.

8. The inspection method according to claim 6, wherein when the at least one light-emitting device is heated by using the laser device, a laser beam is provided on the at least one light-emitting device, for heating the at least one light-emitting device from the first temperature to the second temperature.

9. The inspection method according to claim 1, wherein the voltage is a pulse voltage or a direct current (DC) voltage, and a time period in which the voltage applying device applies the voltage on the at least one light-emitting device is defined as a voltage sustaining time.

10. The inspection method according to claim 9, wherein the voltage sustaining time is between 10 μs to 50 μs.

11. The inspection method according to claim 9, wherein a time period in which the current inspection device measures the current of the at least one light-emitting device in the voltage sustaining time is defined as a current measuring time, and the current measuring time is smaller than or equal to the voltage sustaining time.

12. An inspection method, applied to inspect a die quality of at least one light-emitting device, comprising:
    applying a forward current and a reverse current on the at least one light-emitting device respectively at different time at a first temperature by a current applying device;
    measuring a first forward voltage and a first reverse voltage of the at least one light-emitting device respectively under the forward current and the reverse current at different time at the first temperature, wherein the first forward voltage is measured when the forward current is applied on the at least one light-emitting device, the first reverse voltage is measured when the reverse current is applied on the at least one light-emitting device, and a difference between the first forward voltage and the first reverse voltage is defined as a first voltage difference;
    heating the at least one light-emitting device from the first temperature to a second temperature;

applying the forward current and the reverse current on the at least one light-emitting device respectively at different time at the second temperature by the current applying device;

measuring a second forward voltage and a second reverse voltage of the at least one light-emitting device respectively under the forward current and the reverse current at different time at the second temperature, wherein the second forward voltage is measured when the forward current is applied on the at least one light-emitting device, the second reverse voltage is measured when the reverse current is applied on the at least one light-emitting device, and a difference between the second forward voltage and the second reverse voltage is defined as a second voltage difference; and determining whether a difference between the second voltage difference and the first voltage difference is larger than a failure voltage determination value, wherein if the difference between the second voltage difference and the first voltage difference is larger than the failure voltage determination value, the at least one light-emitting device is determined to be a failed device.

13. The inspection method according to claim 12, wherein the failure voltage determination value is increased with the rise of the second temperature.

14. The inspection method according to claim 12, wherein the values of the forward current and the reverse current are identical or not identical.

15. The inspection method according to claim 12, wherein the at least one light-emitting device is heated by using an oven, a laser device, a microwave device, a heating platform or by a current.

16. The inspection method according to claim 15, wherein when the at least one light-emitting device is heated by using the laser device, a laser beam is provided on the at least one light-emitting device, for heating the at least one light-emitting device from the first temperature to the second temperature.

17. The inspection method according to claim 16, wherein a wavelength range of the laser beam is larger than or equal to a main light-emitting wavelength of the at least one light-emitting device.

18. The inspection method according to claim 12, wherein the forward current and the reverse current respectively comprise a transient current, and the time that the current applying device respectively applies the forward current and the reverse current on the at least one light-emitting device is respectively defined as a forward current sustaining time and a reverse current sustaining time.

19. The inspection system according to claim 18, wherein the forward current sustaining time and the reverse current sustaining time are between 10 μs to 50 μs.

20. An inspection method, comprising:

providing an unfailed die and a failed die;

applying a predetermined inspection pulse current respectively on the unfailed die and the failed die in a predetermined inspection time to obtain a current to voltage relation for distinguishing the unfailed die and the failed die, and defining a pulse damage current when the current to voltage relation of the unfailed die and the failed die applied by the predetermined inspection pulse current is deviated from a linear relation;

defining a failure voltage determination value according to the measured current to voltage relation unfailed die;

applying a rapid inspection pulse current on a die of at least one light-emitting device in a rapid inspection time, wherein the rapid inspection pulse current is smaller than the pulse damage current;

measuring a voltage of the at least one light-emitting device when the rapid inspection pulse current is applied thereon; and determining the at least one light-emitting device is a failed device when the voltage value is larger than the failure voltage determination value.

21. The inspection method according to claim 20, wherein a pulse time of the predetermined inspection pulse current is smaller than 5 sec.

22. The inspection method according to claim 20, further comprising: defining a current inspection range according to the current to voltage relation for distinguishing the unfailed die and the failed die obtained in the predetermined inspection time, wherein the rapid inspection pulse current is in the current inspection range.

23. The inspection method according to claim 22, wherein the current inspection range is larger than or equal to a rated operating current.

* * * * *